United States Patent
Shepherd (12)

(10) Patent No.: US 6,407,540 B1
(45) Date of Patent: Jun. 18, 2002

(54) SWITCHED ATTENUATOR DIODE MICROWAVE POWER SENSOR

(75) Inventor: Ewan W. Shepherd, Bathgate (GB)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/289,279

(22) Filed: Apr. 9, 1999

(51) Int. Cl.[7] .................. G01R 23/04; G01R 19/22; G01R 1/24; G01S 3/02

(52) U.S. Cl. .............. 324/95; 324/119; 324/76.14; 250/250; 343/703

(58) Field of Search .................... 324/95, 115, 119, 324/72.5, 76.14, 258, 260; 250/250; 343/703

(56) References Cited

U.S. PATENT DOCUMENTS

| | | | | |
|---|---|---|---|---|
| 3,639,841 A | * | 2/1972 | Richardson | 325/363 |
| 3,890,571 A | * | 6/1975 | Beyer | 324/95 |
| 4,634,969 A | * | 1/1987 | Edlin et al. | 324/95 |
| 4,873,484 A | * | 10/1989 | Adam | 324/95 |
| 4,943,764 A | * | 7/1990 | Szente et al. | 324/95 |
| 5,204,613 A | * | 4/1993 | Cripps et al. | 324/95 |
| 5,633,582 A | * | 5/1997 | Orndorff et al. | 324/95 |
| 5,656,929 A | * | 8/1997 | Humpherys | 324/95 |

* cited by examiner

*Primary Examiner*—N. Le
*Assistant Examiner*—Anjan K. Deb

(57) ABSTRACT

The present invention relates to a switched attenuator diode microwave power sensor and more particularly to a true average, wide dynamic range microwave power sensor utilizing a switched step attenuator on the sensor input. The present invention provides a sensor that uses a switched attenuator to always keep the signal to the sensor diodes in their "square law" region of operation has significant advantages over the prior art. Staying in the valid "square law" operating region will enable accurate measurements to be made on arbitrarily modulated signals of high peak to average ratio

7 Claims, 2 Drawing Sheets

SWITCHED ATTENUATOR DIODE MICROWAVE POWER SENSOR

BACKGROUND OF THE INVENTION

The present invention relates to a switched attenuator diode microwave power sensor and more particularly to a true average, wide dynamic range microwave power sensor utilizing a switched step attenuator on the sensor input.

U.S. Pat. 4,943,764 patent describes a way to make a power sensor so that each power sensing path is always nominally in it's "square law region" when it is being monitored, and hence able to make accurate average power measurements on a radio frequency signal no matter what form of modulation is imposed on that signal. The first example is of a diode-attenuator-diode configuration that is claimed to give accurate average power measurements on any signal between −70 dBm and +20 dBm. The low power path shown in FIG. 6 which utilizes diodes D1 and D2 will indeed make accurate measurements between −70 dBm and −20 dBm. A problem comes when attempting to make measurements in the −20 dBm to +20 dBm range with the high power path. For all power levels of the RF signal, the low power path is exposed to the full strength of the signal, and at power levels above about −10 dBm, the low power path diodes will begin to change their RF impedance (video resistance) and also generate harmonics due to RF signal limiting. At power levels of +20 dBm, these high power effects from the low power path diodes will become severe, causing inaccurate power measurements due to RF signal limiting, harmonic generation, and increased input reflections from the changed input impedance. This same patent (U.S. Pat. No. 4,943,764) also describes a diode-thermocouple arrangement that does not need an attenuator, but instead uses an antiparallel pair of diodes for the low power path once again, while for the high power path a thermocouple power sensor is used. This diode-thermocouple arrangement will have the same problems of harmonic generation and RF impedance change of the low power path diodes degrading measurement accuracy as the diode-attenuator-diode arrangement did. While this degradation in measurement accuracy can be corrected for to a certain extent for CW signals, it will make the measurement of modulated signals with high peak to average ratios (such as CDMA signals) extremely inaccurate.

U.S. Pat. No. 5,204,613 entitled RF Power Sensor Having Improved Linearity Over Greater Dynamic Range describes a way to make a power sensor so that it utilizes a stack of 2 or more diodes in each arm of the anti-parallel pair in order to reduce the percentage change of the junction capacitance across the stack of diodes for a given RF input power compared to a sensor with a single diode in each arm of the anti-parallel pair. The explanation offered by this patent will only improve a sensor that has significant degradation in performance due to the change in it's junction capacitance with power level. For more sophisticated diode structures, such as the Modified Barrier Integrated Diodes (MBID) used in some sensors, the junction capacitance is so low that it's variation with power level causes minimal change in diode impedance relative to the 50 ohm load. Thus, MBID diode structures would gain no advantage from this technique, and yet they have extremely non "square law" response above −20 dBm, limiting their ability to make accurate average power level measurements on RF signals with high peak power to average power ratios at powers between −20 dBm and +20 dBm. Indeed, any of the commonly used diodes for RF power sensing applications would make inaccurate average power readings on RF signals with high peak to average ratios above −20 dBm even if there was an arbitrarily large stack of diodes that reduced the influence of capacitance variation across the diode junction on the measurement to 0, if indeed the variation in diode junction capacitance was all that contributed to diode non-linearities at high power.

Careful analysis of the causes of non "square law" operation for diodes used in RF power sensing applications has shown deviation from "square law" operation at higher power levels is found even in ideal diode models, and the cause of the deviation involves small signal approximations that are no longer valid at large signal levels. An analysis such as this is carried out in Application Note 64-1A, "Fundamentals of RF and Microwave Power Measurements" Hewlett-Packard Company, and is briefly summarized below:

$$i = I_s(e_\alpha{}^v - 1) \qquad \text{(Eqn. 1)}$$

With i=diode current $I_s$=diode saturation current, constant at a given temperature $\alpha = q/nKT$, (typically 40 volts$^{-1}$)

v=voltage across the diode

Eqn. 1 can be written as a power series as:

$$i = Is(\alpha v + (½!)(\alpha v)^2 + (⅓!)(\alpha v)^3 = \ldots)$$

It is the second, and other even-order terms in this series which provide rectification, and for small power level signals, only the second-order term is significant, so the diode is said to be operating in the "square law region". When v is so high that the fourth and higher order terms become significant, the diode is no longer in the square law region, and is in the "transition region" One way to extend the "square law region" to higher power operation is to stack multiple diodes in series in order to cut down the RF voltage across each diode, extending the small signal range. As more diodes are added to the stack, the region of "square law" operation is extended by 20 log(n) in power while degrading your sensitivity by 10 log(n), where n is the number of diodes in the stack. Thus, the increase in dynamic range of the "square law" operating region, from the noise floor of the sensor to the start of the transition region, is 10 log(n).

The drawback of stacking multiple diodes in series is that present wide dynamic range sensors cover a 90 dB dynamic range from about −70 dBm to +20 dBm, although they can't accurately measure modulated signals with high peak to average ratios above their "square law region", which extends to approximately −20 dB. Any alternative solution should have a dynamic range as close to 90 dB as possible. In order to extend the "square law region" of operation of a power sensor to +20 dBm by using a diode stack, you may use the fact that the extension of "square law region" is proportional to 20 log(N) mentioned in the previous paragraph to find that you would need a stack of 100 diodes. Not only would a 100 diode long stack be physically large, but using the formula that the sensitivity of a diode sensor is degraded by 10 log(N), the new diode would have a noise floor of −50 dBm, and hence a dynamic range of only 70 dB.

Another technique used to try and make accurate wide dynamic range microwave power measurements for high peak to average ratio forms of modulation is to characterize a CW sensor for a given kind of modulation over the power range of interest, for example −70 dBm to +20 dBm. While this technique will work with relatively narrow bandwidth modulations, the necessity of running a high frequency signal up the cable connecting the power sensor to the power meter without degradation will limit this technique to lower frequency modulations. This will be a disadvantage as the modulation bandwidths of signals continue to increase.

SUMMARY OF THE INVENTION

It is an object of the present invention to provide a switched attenuator diode microwave power sensor and more particularly a true average, wide dynamic range microwave power sensor utilizing a switched step attenuator on the sensor input.

In one preferred embodiment, the present invention provides a switched attenuator diode microwave power sensor comprising means for receiving RF signals having wide dynamic power ranges; an anti parallel pair of sensor diode means for measuring the power level of the received RF signals; a switched attenuator means having a first low loss state for lower power range RF signals and a second attenuated state for higher power range RF signals; the switched attenuator means switching the received RF signals through the first low loss state to the sensor diode means when the received RF power level is at the lower power level, said switched attenuator means switching the RF signals through the second attenuated state to the sensor diode means when the received RF power level is above the lower power level range such that the sensor diode means operate in their square law region and measure the power level over the wide dynamic ranges of the received RF signals.

Other objects, features and advantages of the present invention will become apparent from the following detailed description when taken in conjunction with the accompanying drawings.

BRIEF DESCRIPTION OF THE DRAWINGS

The accompanying drawings, which are incorporated in and form a part of this specification and in which like numerals represent like components, illustrate embodiments of the invention and, together with the description, serve to explain the principles of the invention.

DETAILED DESCRIPTION OF THE PREFERRED EMBODIMENTS

Figure 1:
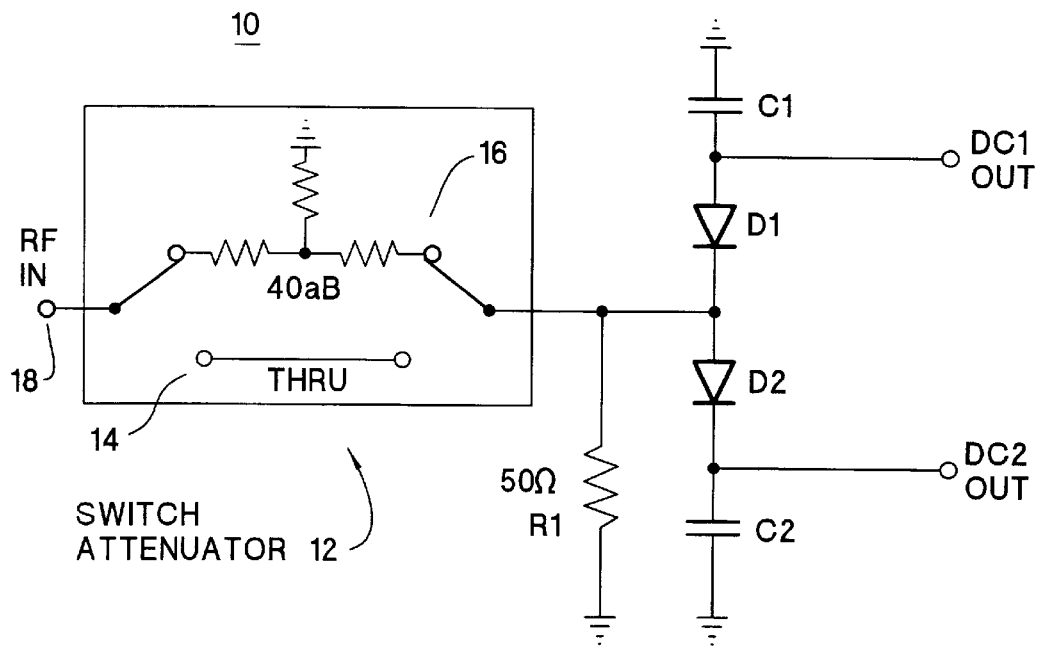
FIG. 1 shows a switched attenuator diode stack microwave power sensor according to the present invention.

Reference will now be made in detail to the preferred embodiments of the invention, examples of which are illustrated in the accompanying drawings, where like numerals indicate like components. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

The present invention provides sensor that uses a switched attenuator to always keep the signal to the sensor diodes in their "square law" region of operation has significant advantages over all four of the examples of prior all mentioned above.

The wide dynamic range radio frequency power sensor (U.S. Pat. 4,943,764) mentioned previously will have the diodes in it's low power path degrade the measurement accuracy of signals above 0 dBm due to their video resistance decreasing and starting to limit the level of the input signal to the high power path, as well as the generation of unwanted harmonics that could distort the measurement. Thus, this technique would not be able to accurately measure arbitrary formats of high peak to average ratio signals if it has been characterized for measuring CW signals or one particular format of signal with a high peak to average ratio. The switched step attenuator concept avoids these problems by only presenting signals between −70 dBm and −20 dBm to the diode sensor so that it is always in its square law region making accurate measurements, and there are no low power path diodes exposed to high level signals to cause distortion. Solid state GaAs switches and other types of microwave switches are available that can handle high level signals (>+23 dBm) with minimal distortion, and so the entire switched attenuator and diode circuit will be able to provide accurate wide dynamic range measurements for arbitrarily modulated signals with high peak to average ratios.

An RF power sensor having improved linearity over greater dynamic range (U.S. Pat. No. 5,204,613) describes a technique to reduce the non-linearities due to power dependent diode junction capacitance causing the power sensor to deviate from its "square law" characteristics and give inaccurate measurements at higher power levels. As mentioned previously, this technique will only help a diode sensor whose performance is currently limited by the variation in junction capacitance vs power, which is not the case for many power sensors which utilize MBID diodes whose junction capacitance is so low that their variation with power is an insignificant part of the reason that the sensor diodes are no longer in the "square law" operating region above −20 dBm. For most diode sensors, the reason they go out of the "square law" operating region is that as the RF input power is raised, the higher order even terms in the Taylor series expansion of the diode operating equation become significant relative to the term due to the square of the RF voltage, and the simplified approximations which give "square law" operation are no longer valid. The switched attenuator diode sensor utilizes a programmable attenuation of 0 or 40 dB to always keep the RF power delivered to the sensor diode at or below −20 dBm in order that the "square law" region operating approximations are well adhered to. Staying in the valid "square law" operating region will then enable accurate measurements to be made on arbitrarily modulated signals of high peak to average ratio. The diode detector with high power square law operation provides a technique to utilize stacked diodes to increase the dynamic range of the "square law" region of operation of a diode-based microwave power sensor. The drawback of this technique, as mentioned previously, is that while the "square law" region of operation is extended by 10 log(N) dB, the sensitivity (and hence the noise floor) of the sensor is also degraded by 10 log(N) dB. Thus to increase the "square law" operating region of the power sensor from 50 dB to 70 dB utilizing the diode stack approach, the overall dynamic range of the sensor would be degraded from 90 dB to 70 dB. The switched attenuator diode approach gives a "square law" dynamic range and overall dynamic range which are equal, and only the insertion loss of the switch in the 0 dB state will degrade the −90 dB dynamic range obtainable with a traditional diode sensor. With high quality GaAs switches having insertion loss of only 1 to 2 dB up to 10 GHZ, the "square law" and overall dynamic range of the switched attenuator diode sensor can be 88 to 89 dB up to 10 GHZ, which is a large improvement over the diode stack approach. Once again, the "square law" dynamic range will correlate to the dynamic range that the sensor is capable of making accurate measurements on arbitrarily modulated signals with high peak to average ratios over.

Lastly, it is useful to mention the technique of taking a standard wide dynamic range sensor and characterizing and providing corrections for it in the power meter over the entire operating power range of interest, typically −70 dBm to +20 dBm. Because the operating region from −20 dBm to +20 dBm would not be in "square law", the DC voltage output will no longer be directly related to the average RF power by a simple straight line relationship, and the corrections for a CDMA signal with a given average power will differ from those for a CW signal for the same average power. However, in this technique, the signal is demodulated in the sensor, and the modulating signals are then sent up to a cable to the power meter, there will be a bandwidth limitation on the modulations that can be accurately measured. The switched attenuator diode sensor always makes measurements in its "square law" operating region, and has all its high frequency modulation confined to the sensor. Thus, the switched attenuator diode can make accurate average power measurements on any kind of signal, whether CW, TDMA, or even a CDMA signal with high peak to average ratio and arbitrarily wide bandwidth.

The first and most basic embodiment of the present invention is shown in FIG. 1 The sensor 10 starts with a standard anti-parallel pair of sensor diodes D1, D2 in parallel with a 50 ohm resistor R1 which is used to terminate the incoming signal from a 50 ohm impedance in a low reflection load. The respective DC1 output and DC2 output are taken from the respective C1, D1 and C2, D2 connections. To this standard sensor topology is added a microwave switched attenuator 12 which is in either the "thru " state 14 with very low loss (as close to 0 dB as possible), or in the 40 dB state 16, with approximately 40 dB loss for the RF input signal 18. For low power signals between approximately −70 dBm and −20 dBm, the switch 12 would be set in the "thru" state 14 to give very low signal attenuation and make the noise floor of the sensor as low as possible. All signals in the approximately −70 dBm to −20 dBm range would be in the "square law" region of the diodes D1, D2, and hence the sensor diodes D1, D2 could make accurate average power measurements, even on signals that had modulation which produced high peak to average power ratios. When the power level is above approximately −20 dBm, the microwave switch 12 would be set so that the 40 dB attenuator 16 is switched in the sensor path, so that now signals entering the sensor 10 in the −20 dBm to +20 dBm range would be attenuated to approximately the −60 dBm to −20 dBm range when they reached the sensor diodes D1, D2. With the signals to the diodes D1, D2 in the −60 dBm to −20 dBm range, the diodes D1, D2 will once again be operating in their square law range, and so will make accurate average power measurements on modulated signals, with high peak to average power ratios, as well as on CW signals.

While for most applications, the preferred embodiment of the architecture shown in FIG. 1 would use GaAs switches in the switched attenuator for reliability and broadband operation, this invention is also meant to include any kind of switches in the switched attenuator structure, whether they are mechanical, PIN diode, silicon, or indeed any other kind of switching structure suitable for routing high frequency signals. Similarly, although the resistive termination RI is shown to be 50 ohms in FIG. 1, this is a nominal value only, and resistor values higher than 50 ohms are specifically meant to be included in this invention in order to give a nearly exact value of 50 ohms for the combination of the resistor and the video resistance of the anti-parallel diode pair to form the best low reflection load. In addition, for systems with inputs impedances other than 50 ohms, the resistor can be adjusted to give a low refelection from the sensor.

In many sensors there is a fixed value input attenuator in front of the diodes in order to give a better input match to the sensor and lower the distortion caused by high power effects in the sensor diodes. The fixed attenuator was not drawn in FIG. 1 for the sake of simplicity, but this invention is specifically intended to include the addition of a fixed attenuator if desired.

Figure 2:
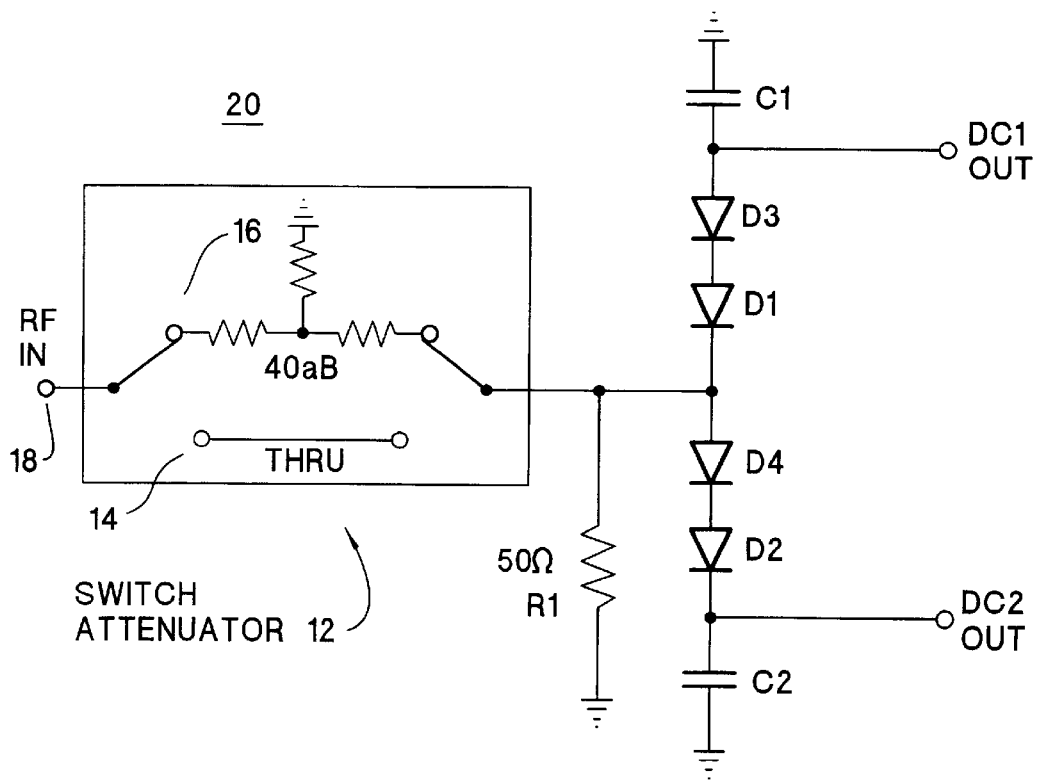
FIG. 2 shoes a switched attenuator diode stack microwave power sensor according to the present invention.
Figure 3:
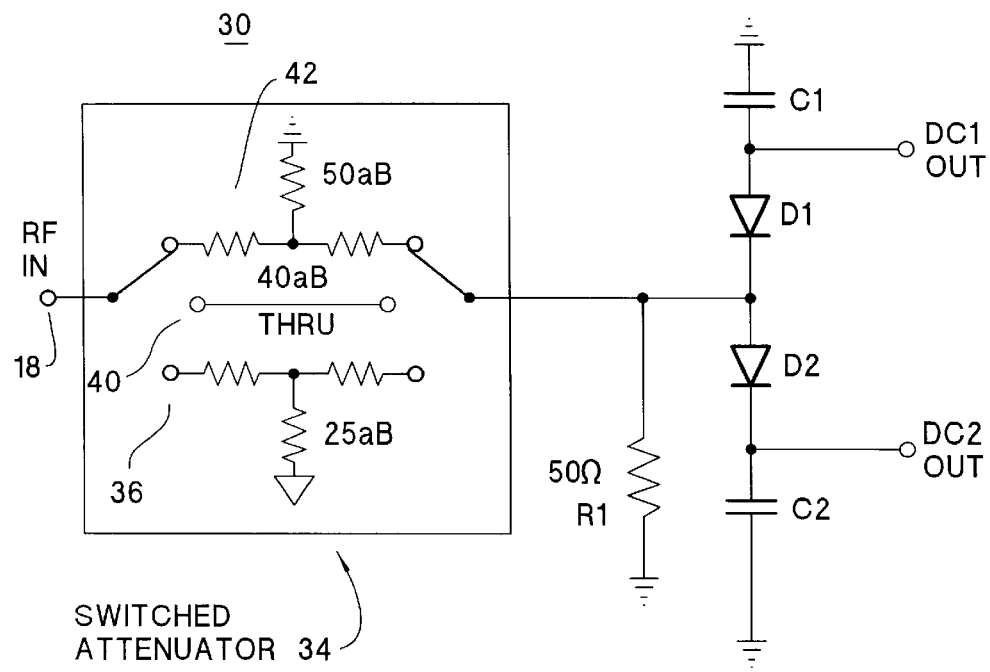
FIG. 3 shows another embodiment of the microwave power sensor according to the present invention.

The next embodiment of the invention is shown in FIG. 2, where a stack of two or more diodes D1, D2, D3, D4 is used in the anti-parallel configuration as the sensing element following the switched attenuator. The use of a diode stack will extend the dynamic range of the square law region of operation by 10 log(N) as mentioned previously (with N being the number of diodes in the stack), allowing for more accurate measurement of the power peaks in high peak to average power ratio signals, specifically near the high power portions of both the low power path and the high power path. Although some sensitivity to very low level signals is given up by employing the diode stack arrangement, in many cases the improvement in linearity at the high power ranges of both paths more than makes up for the loss of sensitivity, The third embodiment of this invention is shown in FIG. 3, which is similar to the basic invention, but instead of the sensor 30 using a switched attenuator with only a 40 dB state, now a switched attenuator 34 is used that can be switched to a 0 dB state 40, 25 dB state 36, or 50 dB state 42. This version of the invention would have the advantage that the power ranges presented to the diodes D1, D2 could now be positioned such that the diodes D1, D2 work in the most accurate range of their "square law" region, and when the sensor 30 is operating in the low power portion of a given range, the received signal is higher above the sensor noise floor allowing faster measurements to be made due to less averaging being needed to achieve a given accuracy level. As an example, if you take a −70 dBm to +20 dBm signal, the 0 dB, 25 dB, and 50 dB switched attenuator sensor 30 would be able to divide this signal up into a −70 dBm to −25 dBm signal into the "thru" path 40, a −25 dBm to 0 dBm signal switched to the 25 dB attenuation path 36, and a 0 m to 20 dBm signal switched into the 50 dB attenuation path 42.

Assuming no fixed input attenuator for this example, this would give a −70 dBm to −25 dBm signal to the sensor diodes D1, D2 for the "thru " path 40, a −50 dBm to −25 dBm signal to the sensor diodes D1, D2 for the 25 dB attenuation path 36, and a −50 dBm to −25 dBm signal to the diodes D1, D2 for the 50 dB attenuation path 42. Where the 0/40 dB switched attenuator structure gave a −60 dBm signal at the lowest power portion of the 40 dB attenuation path, the 0/25 dB/50 dB attenuator structure 34 will have at least a −50 dBm signal in the lowest power portions of the 25 dB path 36 and the 50 dB path 42, improving the signal to noise ratios by 10 dB. In addition, the highest power the sensor diodes would ever see in the 0, 25 dB, and 50 dB attenuator sensor 30 would be −25 dBm, an improvement of 5 dB over the 0/40 dB switched attenuator sensor 10 of FIG. 1, which can translate into better accuracy for modulated signal with very high peak to average ratios.

Figure 4:
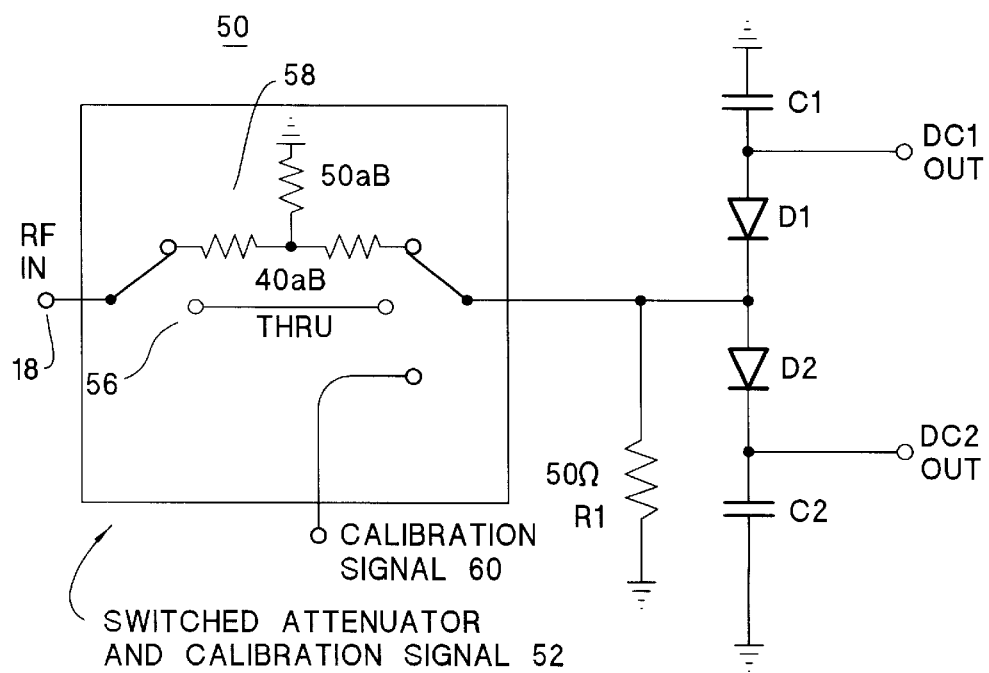
FIG. 4 shows still another embodiment of the microwave power sensor according to the present invention.

The final embodiment claimed for the sensor 50 is shown in FIG. 4, where the configuration of FIG. 1 is used, but now an extra position is added to the switch 52, such that the input to the sensor diodes D1, D2 can either come directly from the RF input signal 18 with no extra attenuation 56, from the RF input attenuation with approximately 40 dB of excess attenuation 58, or from a calibration signal 60 which is typically at a frequency of 50 MHZ. Although typically diode sensors are calibrated at a power level of 0 dBm, the preferred embodiment for the switched attenuator diode sensor would be a calibration signal of approximately −30 dBm, such that the diodes D1, D2 are calibrated in the power range in which they will be used, although the capability of calibrating at other power levels is specifically included in the description of this invention. The advantage of being able to switch in a calibration signal 60 is that the main source of errors in power measurements is often the variation of diode response with temperature, and this calibration will allow for the temperature and humidity dependence of the diode output to be calibrated out without removal of the sensor from the test setup. The ability to keep the sensor connected to the test port while performing a calibration greatly contributes to utility, permitting fully automated measurements as well as frequent calibrations performed without human intervention.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A diode microwave power sensor comprising:

means for receiving RF signals having wide dynamic power ranges, said means including impedance match termination circuit;

sensor diode means operating within a square law region for measuring the power level of the received RF signals;

a switched attenuator means having a first low loss state for lower power range RF signals and a second attenuated state for higher power range RF signals; the switched attenuator means switching the received RF signals through the first low loss state to the sensor diode means when the received RF power level is at the lower power level, said switched attenuator means switching the RF signals through the second attenuated state to the sensor diode means when the received RF power level is above the lower power level range such that the sensor diode means operate in the square law region and measure the power levels over the wide dynamic ranges of the received RF signals. RF signals.

2. A power sensor as in claim 1 wherein the sensor diode means include a pair of sensor diodes for measuring the power levels of the received RF signals.

3. A power sensor as in claim 2 wherein the lower power level range is between approximately −70 dBm and −20 dBm.

4. A power sensor as in claim 3 wherein the first low loss state is close to 0 dB and the second attenuated state is approximately 40 dB.

5. The power sensor as in claim 3 wherein the first low loss state is close to 0 dB, the second attenuated state is approximately 25 dB, and including a third attenuated state of approximately 50 dB.

6. The power sensor as in claim 3 wherein the switched attenuator includes means for receiving a calibration signal for calibrating the sensor diode means.

7. The power sensor as in claim 3 wherein the switched attenuator includes means for receiving either a calibration signal of an RF input from an RF switch preceding the switched attenuator for calibrating the switched attenuator and the sensor diode.

\* \* \* \* \*